United States Patent
Czech et al.

(10) Patent No.: US 6,696,208 B2
(45) Date of Patent: Feb. 24, 2004

(54) METHOD FOR EXPERIMENTALLY VERIFYING IMAGING ERRORS IN OPTICAL EXPOSURE UNITS

(75) Inventors: Günther Czech, Langebrück (DE); Ernst-christian Richter, Erlangen-Bruck (DE); Ulrich Scheler, Dresden (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/135,471

(22) Filed: Apr. 30, 2002

(65) Prior Publication Data

US 2003/0054268 A1 Mar. 20, 2003

(30) Foreign Application Priority Data

Apr. 30, 2001 (DE) ......................................... 101 21 179

(51) Int. Cl.[7] ................................................ G03F 9/00
(52) U.S. Cl. ....................................................... 430/30
(58) Field of Search ........................................... 430/30

(56) References Cited

U.S. PATENT DOCUMENTS 5,234,793 A * 8/1993 Sebald et al. ............... 430/323
5,234,794 A * 8/1993 Sebald et al. ............... 430/325

FOREIGN PATENT DOCUMENTS

EP 0 395 917 B1 11/1990

* cited by examiner

*Primary Examiner*—Christopher G. Young
(74) *Attorney, Agent, or Firm*—Laurence A. Greenberg; Werner H. Stemer; Ralph E. Locher (57) ABSTRACT

Imaging errors in optical exposure units for the lithographic structuring of semiconductors are determined. First, a latent image of a mask is first produced in a photoactivatable layer by exposure using the optical exposure unit to be tested. After heat treating for increasing the contrast and developing the exposed resist, the latter is treated with an amplification agent which preferably diffuses into the exposed parts of the photoresist. There, it reacts with groups of the photoresist. This leads to an increase in the layer thickness of the resist in the exposed parts. A topographical image of the surface of the photoresist, which can be created, for example, by scanning electron microscopy, then indicates imaging errors by protuberances which are located outside the image of the mask. The method permits testing of optical exposure units under production conditions and thus facilitates the adjustment and the checking of all components of the exposure system used for the production of microchips.

17 Claims, 3 Drawing Sheets

METHOD FOR EXPERIMENTALLY VERIFYING IMAGING ERRORS IN OPTICAL EXPOSURE UNITS

BACKGROUND OF THE INVENTION

Field of the Invention

The invention lies in the semiconductor fabrication technology field and relates, more specifically, to a method for determining imaging errors in optical exposure units as used for the lithographic structuring of semiconductors, a method for optimizing optical exposure units for the lithographic structuring of semiconductors, and a method for determining the local exposure dose.

In the production of miniaturized electronic circuits on microchips, the structuring of the semiconductor materials, for example silicon wafers, is carried out at present mainly by optical lithography methods. First, a thin layer of a photoresist is applied to the semiconductor. This layer is then exposed to laser light, a mask which corresponds to a magnified image of the electronic circuit being arranged in the beam path. During the exposure, a miniaturized image of the photomask is produced in the photoresist layer. Depending on the photoresist used, the exposed parts in the case of a positive photoresist or the unexposed parts in the case of a negative photoresist can then be removed in further steps. The photoresist remaining on the semiconductor forms a mask corresponding to the electronic circuit so that, for example, the semiconductor can be etched or doped selectively in the bare parts or further layers can be deposited selectively on the bare surfaces of the semiconductor. In the course of the constantly increasing miniaturization of the semiconductor elements of electronic circuits, the imaging quality of the mask on the photoresist is having to meet increasingly high requirements. In order to be able to produce even very small structures in the region of less than 1 $\mu$m without defects, the properties of all components of the imaging means, i.e. of the exposure apparatus, of the photomask and of the photoresist, are of decisive importance.

Owing to their high image contrast, the halftone phase masks used in the production of integrated semiconductor elements permit the production of virtually perpendicular sidewalls in the structured photoresist, even in the case of very small dimensions of the structures, but they have the undesired effect of sidelobe printing. This means that, in addition to the maximum of the incident exposure dose, secondary maxima occur in parts of the photoresist outside the reproduced structure of the circuit and lead there to undesired structuring of the photoresist. This can in certain circumstances cause a defect in the integrated circuit. In the case of so-called alternating phase masks, such as chromium masks, phase conflicts play a dominant role. These effects, too, can lead to deviations from the required structure size of the elements on the semiconductor module and cause shorts or openings in the case of critical mask structures and hence lead to reduced yields.

A further potential source of errors is the optical exposure unit used for reproducing the mask on the photoresist. Spherical lenses only approximately permit error-free reproduction of the structures of a microelectronic circuit which are defined by the mask on the photoresist. Imaging errors are caused by lens defects and aberrations. It is true that these can be substantially avoided by the use of lens systems and of aspherical lenses. However, in order to qualify such optical exposure systems, such as wafer steppers and step-and-scan exposure units, for semiconductor production, it is necessary first to test them for imaging errors. In this context, it is of particular interest to investigate the effect of imaging errors under conditions close to those in production, i.e. for example also with the use of the mask types used in production and of the corresponding mask layout.

At present, the analysis of imaging errors of optical apparatuses which are used for the production of microchips is possible only by means of special analytical apparatuses with which the lens is measured by means of interferometry, or by complicated theoretical estimations. At present, a type of pinhole camera and simulations are used for analyzing the light intensity distribution on the wafer surface or in the photoresist. In this method, however, the result of the measurements can be influenced by the photoresist. Furthermore, there is in this method no simple relationship between a simulation on the basis of the Zernike polynomials and the data from the experiment carried out in practice. Limitation to locally fixed points of the exposure field is also disadvantageous.

SUMMARY OF THE INVENTION

It is accordingly an object of the invention to provide an experimental method for determining imaging errors of optical exposure units for the lithographic structuring of semiconductors, which overcomes the above-mentioned disadvantages of the heretofore-known devices and methods of this general type and which can be carried out rapidly and simply under conditions that are close to those in production.

With the foregoing and other objects in view there is provided, in accordance with the invention, a method of determining imaging errors of optical exposure units for the lithographic structuring of semiconductors. The method comprises the following steps:

(a) placing a photomask in an object plane of the optical exposure unit to be tested, the photomask defining a test image to be reproduced;

(b) placing a photoactivatable layer in the image plane of the optical exposure unit to be tested, the photoactivatable layer containing a photoactivatable component and a compound permitting linkage of an amplification agent;

(c) exposing the photoactivatable layer, the test image to be reproduced being reproduced in the photoactivatable layer and a chemical or physical change to the photoactivatable layer being effected in the photoactivatable layer in dependence on an incident light dose, for producing a latent image of the test image is produced;

(d) applying an amplification agent to the exposed photoactivatable layer to react the amplification agent with the compound in the photoreactive layer, the reaction between the compound and the amplification agent being dependent on a local exposure dose incident on the photoactivatable layer, to increase a layer thickness of the photoactivatable layer as a function of the incident light dose;

(e) removing excess amplification agent;

(f) determining a local distribution of an increase in layer thickness of the photoactivatable layer;

(g) comparing the distribution of the increase in layer thickness with the test image to be reproduced and determining the local increases in layer thickness outside the test image to be reproduced; and (h) assigning the local increases in layer thickness outside the test image to be reproduced to imaging errors of the optical exposure unit to be tested.

There is also provided, in accordance with the invention, a method of optimizing an optical exposure unit for the lithographic structuring of semiconductors, which comprises:

performing the method as outlined above to create a layer thickness distribution in a photoactivatable layer with an optical exposure unit to be optimized and using a test image;

determining an experimental distribution of the exposure intensity from the layer thickness distribution;

comparing the experimental distribution of the exposure intensity with a theoretical distribution of the exposure intensity;

determining an imaging error of the optical exposure unit from a difference between the experimental and the theoretical distribution; and modifying the optical exposure unit by alleviating or completely eliminating the imaging error.

With the above and other objects in view there is also provided, in accordance with the invention, a method for determining a local exposure dose, which comprises:

producing a photoactivatable layer comprising a photoactivatable material on a substrate;

exposing the photoactivatable layer to exposure radiation to produce a latent image in the photoactivatable layer;

subsequently treating the photoactivatable layer with an amplification agent that reacts, in dependence on the locally incident exposure dose, with components of the photoactivatable material and thereby forms at least one chemical bond; and subsequently determining the local increase in the layer thickness of the photoactivatable layer and assigning the local increase in the layer thickness to a local exposure dose.

The method for determining imaging errors of optical exposure is based on an effect that is described in U.S. Pat. Nos. 5,234,794 and 5,234,793 and in the corresponding European patent EP 0 395 917 B1. In that method, after development of the resist structure, an additional step is carried out by treating the already completely formed resist structure with an expansion reagent. The expansion reagent diffuses into the resist and reacts there with reactive groups present in the resist and acting as anchor groups. As a result, the expansion reagent is chemically bonded in the resist, which leads to a volume increase and hence to an expansion of the resist structures. This expansion in turn leads to a narrowing of the valleys formed between the resist structures, so that a substantial improvement in the resolution and hence the production of finer structures are possible.

The method according to the invention is based on the knowledge that the speed of diffusion of the expansion reagent in the photoresist is influenced by the polarity of the resist. During the exposure of the photoresist, the polarity of the photoresist changes in the exposed parts. For example, in the case of positive photoresists, the exposure results in the liberation of an acid which in turn can initiate chemical reactions in the photoresist. The change caused by the exposure in the polarity of the resist and hence in the speed of diffusion of the diffusing expansion agent in turn results in different amounts of the expansion agent diffusing depending on the effective exposure dose, which in turn leads to a locally varying increase in volume of the layer thickness of the photoresist. The increase in layer thickness thus directly represents the incident exposure dose.

During the exposure of the photoactivatable layer, ideally there should be a step-like dependence of the chemical reaction on the effective exposure dose. Below a certain threshold value, no reaction should take place in the photoresist, whereas a complete chemical reaction should be immediately initiated in the photoresist above the threshold value. Although such behavior can be approximately achieved by the development of high-quality photoresists, it is still necessary to accept a certain range wherein a weak chemical reaction is initiated by the light but does not yet lead to structuring of the resist in the subsequent development. In the course of the development of the method according to the invention, it was found that there is substantial diffusion of the expansion agent even into weakly exposed parts before this leads to a change in the resist structure where development is carried out normally. The method according to the invention therefore also permits the detection, in the photoactivatable layer, of exposed parts wherein the exposure dose is well below the threshold dose, i.e. on which such a small exposure dose has acted that, for example in the case of a positive resist, this leads to no removal of the photoactivatable layer in the development step.

After the method according to the invention has been carried out, a relief-like pattern which corresponds to the locally incident exposure dose is obtained on the surface of the photoresist. The total exposure field is reproduced on the wafer or on the photoresist used as the photoactivatable layer. Thus, a distribution of the exposure intensity on the wafer surface can be derived directly from the height increase caused by the amplification agent. Said distribution can in turn be compared directly with the results of corresponding simulations. By comparison of the values from experiment and simulation, it is possible in turn to draw conclusions about imaging errors of the optical unit. In addition to an assessment as to whether the optical exposure unit tested can be used for the production of microchips, an analysis of the sources of errors in the optical exposure unit is thus also possible.

As far as possible, an "ideal" photomask, i.e. a mask which itself causes no imaging errors, is used for the analysis of the optical exposure unit. When the method according to the invention is carried out in practice, a mask which as far as possible meets these requirements is used. Furthermore, it is also possible directly to use a photomask whose mask image corresponds to the microelectronic circuit to be produced. In this case, interplay between photomask and optical exposure unit can also be investigated.

The increase in layer thickness brought about according to the invention therefore provides a very sensitive method by means of which even low exposure doses, as caused by imaging errors of optical exposure units, can be determined.

In the reproduction of the test image on the photoactivatable layer, it is not only the desired test image which is reproduced but also all imaging errors caused by the optical exposure unit. These imaging errors generally produce in the photoactivatable layer an exposure dose which is below the threshold value above which the exposure produces a change which, for example, leads to delamination of the exposed parts subsequently during the development of the exposed photoactivatable layer. However, the exposure is sufficient for triggering a change in the polarity of the photoactivatable layer, which change can subsequently be visualized as an increase in layer thickness by the amplification agent.

Substantially the same conditions as are described in the above-mentioned patents (U.S. Pat. No. 5,234,794, U.S. Pat. No. 5,234,793, EP 0 395 917 B1) are applicable for the production of the photoactivatable layer, the photoactivatable material, the amplification agent and the conditions for the reaction of the amplification agent with the photoactivatable material, the expansion agent described in this publication acting as an amplification agent in the method according to the invention. This difference in designation is intended to make clear the fact that, in the method according to the invention, an expansion of the resist structures is not required, but the reaction is carried out at lower concentrations or for shorter reaction times, only a reaction of the amplification agent with the groups of the resist taking place in the exposed parts.

The diffusion of the amplification agent into the exposed photoactivatable layer is influenced by the polarity of the photoactivatable layer. As a result of the exposure, a change in the polarity of the photoactivatable layer which is dependent on the locally incident exposure dose can be effected by the photoactivatable component, so that the diffusion of the amplification agent into the photoactivatable layer differs locally as a function of the local polarity of the photoactivatable layer or as a function of the incident exposure dose. In parts exposed to a higher exposure dose, faster diffusion of the amplification agent and hence linkage of a larger amount of amplification agent into the photoactivatable layer and hence finally a greater increase in layer thickness then take place in the case of, for example, positive-working photoresists. An increase in layer thickness in the context of the invention can be effected even by simply incorporating the amplification agent into the photoactivatable layer. Preferably, the amplification agent is chemically bonded in the photoactivatable layer.

A change in the polarity of the photoactivatable layer which is dependent locally on the exposure dose can be achieved, for example, if a photo acid generator is present as the photoactivatable component in the photoactivatable layer. Depending on the incident exposure dose, a larger or smaller amount of acid is then liberated, which causes a corresponding change in the polarity of the photoactivatable layer. The photo acid generator used may be any compound per se which liberates an acid on exposure to the exposure radiation used. Onium compounds as described, for example, in the commonly assigned European patent document EP 0 955 562 are advantageously used. The acid liberated forms a latent image of the test image to be reproduced and of the imaging errors occurring during reproduction. The acid liberated has not yet led to any chemical change in the structure of the photoactivatable layer through its liberation but has only resulted in a local change in the polarity of the photoactivatable layer due to the acid liberated locally as a function of the incident exposure dose.

In order to amplify the effect of a polarity change, the photoactivatable layer is preferably formed in such a way that the acid liberated results in a change in the structure of the compound contained in the photoactivatable layer, by means of which change a greater and permanent change in the polarity is imposed on the photoactivatable layer. For this purpose, the photoactivatable layer preferably contains a polymer having acid-labile groups which are eliminated under the action of acid and liberate a polar group. The polymer contains, in the chain or as a side group, acid-labile groups which impart lower solubility in polar solvents to the polymer. By the action of acid, the acid-labile groups are eliminated and polar groups are produced on the polymer. The acid-labile group used may be, for example, the following groups: tert-alkyl ester, tert-butyl ester, tert-butoxycarbonyloxy, tetrahydrofuranyloxy, tetrahydropyranyloxy, tert-butyl ether, lactone or acetal groups. These acid-labile groups can be introduced into the polymer, for example, by copolymerization of suitable monomers which comprise the acid-labile groups. Preferably used monomers are those which have repeating units in the polymer with high transparency at short wavelengths, for example of 157 nm. Such repeating units have, for example, alkyl or cycloalkyl groups or are completely or partly fluorinated. Suitable polar groups which are liberated after elimination of the acid-labile group are, for example, carboxyl groups or in particular acidic hydroxyl groups. The amplification agent can then be bonded to the liberated polar groups, for example via an ionic bond, or the polar group can also nucleophilically attack a corresponding group present in the amplification agent and in this way can effect a linkage of the amplification agent to the polymer.

A so-called "chemical amplification resist" is particularly preferably used for the photoactivatable layer. Such resists contain molecules having acid-labile protective groups, such as a tert-butyl group, which are eliminated under acid catalysis. The photoactivatable material furthermore contains a photoactivatable acid (PAG "photo acid generator"). If a proton is liberated from the PAG by the incident exposure wavelength, said proton acts as a catalyst for the elimination of the tert-butyl groups, which are converted, for example, into isobutene. The incident quantity of light is therefore amplified in its effect since a single proton leads to the elimination of a plurality of tert-butyl groups. As a result of the elimination of the tert-butyl groups, the polarity of the resist changes greatly in the exposed part so that the speed of diffusion and the amount of the diffusing amplification agent also increase. Hence, the sensitivity of the method according to the invention increases. With the use of such a photoresist, it is therefore advantageous if, after the production of the latent image, a contrasting step is carried out, preferably by baking.

The polymer is preferably formed in such a way that, in addition to the acid-labile groups, further groups to which the amplification agent can be chemically bonded are provided. For this purpose, the polymer contains anchor groups which permit linkage of the amplification agent to the polymer with formation of a covalent bond. An anchor group is understood as meaning a functional group which can be nucleophilically attacked by a nucleophilic group with formation of a covalent bond, so that groups from the amplification agent can be subsequently introduced into the film-forming polymer. These anchor groups must have sufficient reactivity to be able to undergo, within periods suitable for practical use, a sufficient reaction with the amplification agent, by means of which the groups for increasing the layer thickness are introduced. Groups which have sufficient reactivity for use as anchor groups are, for example, isocyanates, epoxides, ketenes, oxiranes, urethanes or acid anhydrides. Carboxylic anhydride groups have proven particularly advantageous since they firstly have sufficient stability to permit uncomplicated preparation and processing of the polymer or of the resist and secondly have a sufficiently high reactivity to undergo reaction with an amplification agent within periods of interest for industrial use. A plurality of said anchor groups may also be provided in the polymer for a reaction with the amplification agent.

A functional group, particularly suitable for carrying out the method according to the invention, in the photoresist is the anhydride group, in particular the cyclic anhydride group. This does not have a high absorption even at deep UV (DUV, wavelengths below 300 nm), which is indispensable for high-resolution structuring. The thermomechanical properties of anhydrides, in particular the high glass transition temperatures, are also suitable for use as a photoresist. With conventional photoactive elements, high contrasts in combination with high resolution can be achieved with anhydride-containing photoresists. This is due to the large polarity difference which occurs between exposed and unexposed parts during the development. Particularly in the case of positive resists, the hydrophilic properties imparted to the exposed parts of the photoresist by the decomposition of the photoactive component are enhanced by a suitable development process. With developers containing amino groups, the anhydride function is hydrolyzed and the delamination of exposed parts in the development process is thus increased or improved. In any development of the exposed photoresist which is performed, the anhydride function in the unexposed parts (in the case of positive resists) remains unhydrolyzed. In the method according to the invention, it is therefore available as a functional group for binding the amplification agent in weakly exposed parts, i.e. in parts wherein a chemical reaction has already been initiated by the incident weak radiation but which did not take place to an extent such that this leads to removal of the photoresist during development. If anhydride functions are present in the photoresist, the amplification agent should advantageously have at least one amino group as a functional group.

For a photoresist usually consisting of a base polymer and a photoactive component, the choice of the polymers (for the base polymer) depends in particular on the required transparency for the given exposure wavelength or the wavelength range. Alternating copolymers of maleic anhydride and styrene and of maleic anhydride and allyltrimethylsilane are also suitable, particularly for the DUV range. Both polymers have outstanding transparency in the DUV range (for example at 248 nm) and in the NUV range (near UV range), high thermal stability (glass transition temperature>160° C.) and outstanding lithographic properties in combination with conventional photoactive components, preferably with esters of naphthoquinonediazide-4-sulfonic acid, and suitable developers.

Further suitable polymers which contain the cyclic anhydride group but also other functional groups suitable for the method according to the invention have, for example, the following general structural formulae A to D or are derived from polyurethane, poly(meth)acrylate, polyester or polyether:

A

B

C

D where $R^1$=H, alkyl, aryl, halogen, halogen-substituted alkyl or aryl, and $0<k/(k+r)<0.6$ is applicable for A; k and r represent values which correspond to the molar fractions of the repeating units in the polymer. The values for k and r are chosen so that they comply with the stated condition. The chain length of the polymers is chosen according to the required properties, for example the glass transition temperature, and can be determined by a person skilled in the art by corresponding experiments. $R^1$ may be, for example:

—COOH—COOR, —CH$_2$Si(CH$_3$)$_3$—Si(CH$_3$)$_3$, —Si(OCH$_3$)$_3$, $R^2$ = O, NH, S,
$R^5$ = H, CH$_3$ und
$R^{10}$ = H oder As is evident from the structural formulae shown, anhydride, carboxyl, hydroxyl and epoxide groups are preferably contained as anchor groups for binding the amplification agent in the photoresist. The (base) polymers may carry both chemically different and chemically identical functional groups.

The choice of the polymers depends in particular on the transparency in the irradiation wavelength range. For the deep UV range, for example 248 nm, anhydride-containing resists are preferably used in the method according to the invention. These may have the corresponding and above-mentioned structures or may be derived from further anhydride-containing monomers which contain a double bond as a polymerizable function and have, for example, one of the general structures N, O, P or Q wherein R[11] represents H or alkyl and R[12] represents an alkyl or aryl radical.

In order to be able to react with the reactive groups of the photoactive material in the photoactivatable layer, the amplification agent must have corresponding functional groups. A suitable group is, for example, the hydroxyl group or the amino group. These groups can readily nucleophilically attack an anchor group of the polymer. The amplification agent is preferably stable to hydrolysis and is used as an aqueous alcoholic solution or emulsion, it being possible to carry out treatment with the amplification agent under standard conditions with regard to atmosphere, pressure and temperature.

The method according to the invention can be effected as a simple "wet chemical" process which can be carried out, for example, in an aqueous medium in simple open apparatuses. The degree of amplification, i.e. the volume increase, can be controlled by corresponding variation of the reaction parameters. Thus, the concentration of the amplification agent in a solution acting on the photoactivatable layer can be increased, the temperature during the treatment of the photoactivatable layer with the amplification agent can be varied or the duration of treatment with the amplification agent can be appropriately changed in order to establish the desired amplification. Suitable conditions can be easily determined by a person skilled in the art by means of appropriate preliminary experiments. The reaction of the amplification agent with groups of the photoactivatable material in the photoactivatable layer is diffusion-controlled. Consequently, the increase in volume due to the binding of the amplification agent also takes place sufficiently slowly to be able to control it exactly by means of the parameters of the method.

For carrying out the method according to the invention, the amplification agent is preferably dissolved in a water-containing medium which may be a solution or emulsion. A purely aqueous medium, or any water-containing solution which preferably contains alcohol as a further, water-miscible component is also possible. However, other organic solvents are also possible. The amplification agent may be soluble in the medium. However, it is also possible to use an amplification agent which is insoluble in the medium. The amplification agent is then used in the form of an emulsion.

The treatment with the amplification agent can also be carried out in a manner such that the amplification agent is present in the gas phase. In this case, in particular the temperature at which the treatment is carried out offers a good possibility for control, which of course also applies to an amplification agent in the liquid medium. Increasing temperature accelerates the amplification.

The linking of the amplification agent to the photoactive material takes place even if only one functional group of the amplification agent is capable of reacting with a reactive group of the photoresist. Even better binding of the amplification agent to the photoresist takes place, however, if the amplification agent carries at least two functional groups. Thus, the amplification agent not only can be loosely bound but can bring about crosslinking of the resist structure by "two-point attachment".

Further requirements with respect to the amplification agent relate, for example, to its solubility in a medium used as solvent. It should be either readily soluble or at least readily emulsifiable, but on the other hand, in the case of good solubility, the solubility of the treated resist structure should not also be increased. This requires a balance between good handling properties of the agent (through good solubility) and the properties of the treated resist structure (insolubility). These requirements are dispensed with in the case of a chemical treatment from the gas phase.

The size or the molecular weight of the amplification agent may be as small or low as desired but has an upper limit. The larger or the heavier the amplification agent, the more difficult is the diffusion into a resist structure. However, good diffusibility of the amplification agent is necessary in order to achieve a sufficient increase in the layer thickness and hence to permit the detection of only weakly exposed parts. The deeper the amplification agent can diffuse into the resist structure, the greater the number of functional groups available to it for reaction and the greater the achievable amplification.

A large number of substances can be used as the amplification agent. Preferred functional groups which are suitable for reaction with the resist structure or with the base polymers of the photoresist are, for example, aliphatic primary or secondary amino groups. Diamines containing aromatic structures, for example 1,3-diaminomethylbenzene, and chain-like dimethyl-siloxanes having terminal aminopropyl units and 1–50, preferably 2–12, silicon atoms per molecule have proven particularly useful. Such amplification agents are represented, for example, by the general structural formulae G and H:

wherein the following is applicable for H: a=0–50

If a copolymer of maleic anhydride and styrene is used as photoactivatable material, 1,3-diaminomethylbenzene is particularly suitable as an amplification agent. Amplification agents of the general structural formula H are particularly suitable if the photoactivatable material is based on a copolymer of maleic anhydride and allyltrimethylsilane.

Further examples of amplification agents having amino-functional groups but also having other functional groups can be represented by the general structural formulae I, K, L, M wherein the following is applicable for K: m=1–30, n=0–3, $R^3$=H, alkyl, aryl, cycloalkyl and $R^4$=

Silsesquioxanes are also suitable as an amplification agent.

Aliphatic diaminosiloxanes having 1–50, preferably having 2–12, silicon atoms per molecule are particularly suitable for the method according to the invention.

Bisaminooligodimethylsiloxanes having 1–50, preferably 2–12, silicon atoms per molecule are particularly preferred.

Examples of further suitable amplification agents are represented by the general structural formulae E, F, S, U and T:

wherein the radicals R, independently of one another, represent alkyl, aryl or H, the following is applicable for T: b, d>1, c>0, and $R^8$ denotes the radicals and the other radicals stated generally have the abovementioned meaning.

For the less reactive functional groups on the amplification agent, it may be advantageous if a catalyst which accelerates the reaction with the functional groups of the photoactivatable material of the photoactivatable layer is mixed with said amplification agent.

In a specific embodiment of the method according to the invention, after the production of the latent image by exposure and an optional subsequent thermal treatment for increasing the contrast, the photoactivatable layer is developed with an alkaline developer. Those parts on which an exposure dose which exceeds the threshold dose has acted are dissolved out of the photoactivatable layer. This threshold dose is dependent on the type and the chemical formulation of the photoresist.

Parts of the photoactivatable layer on which light in a lower dose than the threshold dose has acted initially remain invisible after the development. By means of the method according to the invention, those parts in the remaining resist on which a dose lower than the threshold dose has acted can now also be visualized since the amplification agent preferably diffuses into and is incorporated in these parts. After the method according to the invention has been carried out, these parts then appear as protuberances on the surface of the photoresist.

Defects which are caused by reflection of the incident light at the surface of the semiconductor substrate or at other layers arranged below the photoactivatable layer can be avoided by applying an antireflection layer to the substrate, below the photoactivatable layer. Both antireflection layers comprising inorganic material, such as, for example, silicon oxynitrides, and antireflection layers comprising organic material are suitable here. In the antireflection layer, the incident radiation is either absorbed or is extinguished by interference.

A particularly rapid and simple evaluation is possible if an enlarged topographical image of the surface of the photoactivatable layer is produced for determining the increase in the layer thickness. Such an image of the topology of the treated surface of the photoactivatable layer can be produced, for example, by means of scanning electron microscopy or atomic force microscopy (AFM).

The method according to the invention is particularly suitable for testing optical exposure units as used for the production of microchips. The latent image may therefore comprise structures having a diameter of less than 10 µm, in particular in the submicrometer range, and in particular the latent image may be an image of an electronic circuit.

The method according to the invention permits testing of the optical exposure unit under production conditions. A monochromatic radiation, in particular laser radiation, is advantageously used for the exposure. An exposure radiation having a wavelength of less than 500 nm is advantageously used for the exposure, in particular an exposure radiation having a wavelength of 436, 365, 193, 157 or 142 nm. Radiations having said wavelengths are used in general in the structuring of microchips.

The method is, per se, independent of the type of photoresist used for the photoactivatable layer, provided that it permits binding of the amplification agent. If the photoactivatable layer consists of a positive photoresist, the exposed parts are thickened by chemical aftertreatment so that imaging errors are emphasized as protuberances on the photoactivatable layer.

If a negative photoresist is used, the unexposed parts are accordingly thickened by the chemical aftertreatment. The imaging errors are then represented by indentations.

In order to avoid falsifications of the results of the method according to the invention, an ideal or at least almost ideal photomask should as far as possible be used for the exposure of the photoresist and the production of the latent image.

By means of the method according to the invention, imaging errors of optical exposure units for the lithographic structuring of semiconductors can be very easily determined. The method can therefore also be used for optimizing such units. The invention therefore also relates to a method for optimizing optical exposure units for the lithographic structuring of semiconductors, a layer thickness distribution being created in a photoactivatable layer by the method described above using an optical exposure unit to be optimized and using a test image, an experimental distribution of the exposure intensity being determined from the layer thickness distribution, the experimental distribution of the exposure intensity being compared with a theoretical distribution of the exposure intensity, an imaging error of the optical exposure unit being determined from the differences between experimental and theoretical distribution of the exposure intensity and the optical exposure unit to be optimized being modified so that the optical exposure unit to be optimized no longer has the imaging error or has it in reduced form.

By a simulation based on the Zernike polynomials which use 36 variables for describing aberrations mathematically, a theoretical distribution of the exposure intensity can be determined. This can now be compared with the experimentally determined distribution of the exposure intensity. By changing the variables of the simulation, it is also possible to simulate the experimentally determined distribution, so that it is possible in turn to determine errors in the imaging system of the optical exposure unit from the difference between the variables of theoretical and experimental distribution.

The increase in layer thickness due to the treatment of the photoactivatable layer with the amplification agent directly reproduces the effective exposure dose. The invention therefore also relates to a method for determining the local exposure dose, at least one photoactivatable layer comprising a photoactivatable material being produced on a substrate, a latent image being produced in the photoactivatable layer by exposure to an exposure radiation, the photoactivatable layer being treated, after the exposure, with an amplification agent which reacts locally with components of the photoactivatable material with formation of at least one chemical bond, and, after the treatment with the amplification agent, the increase in the layer thickness of the photoactivatable layer being determined.

As already described further above, various modifications can also be carried out in the case of this method in order to increase the sensitivity. Thus, an additional contrasting step can also be carried out in the case of this method, for example by heat treatment. Here too, the evaluation is advantageously effected in a manner such that a topographical image of the surface is created with the aid of scanning electron microscopy or AFM.

Other features which are considered as characteristic for the invention are set forth in the appended claims.

Although the invention is illustrated and described herein as embodied in an experimental method for verifying imaging errors in optical exposure units, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The method according to the invention is generally carried out by a procedure wherein the substrate is first coated with a photoresist by spin-coating. The photoresist layer is then dried at 60 to 160° C., preferably 90 to 140° C. After drying, the thickness of the photoresist layer is about 50 to 3 000 nm, preferably 200 to 300 nm. The photoresist layer is exposed to an exposure dose of 1 to 5 000 J/m$^2$, preferably 200 to 900 J/m$^2$. Any baking carried out in order to increase the contrast is carried out at 60 to 200° C., preferably 100 to 150° C. This may be followed by a development step using an alkaline developer. A developer suitable for this purpose is, for example, tetramethylammonium hydroxide in water, the treatment times chosen being between 20 and 80 seconds, preferably 30 and 60 seconds. The development is followed by a washing step and a drying step. A solution of the amplification agent is then applied to the dried surface of the sample by the puddle method, said amplification agent acting for between 20 and 120 seconds, preferably 30 and 60 seconds. After the treatment with the amplification agent, the surface is cleaned by washing and is dried again. The evaluation of the topology is then effected by scanning electron microscopy or by AFM.

Figure 1:
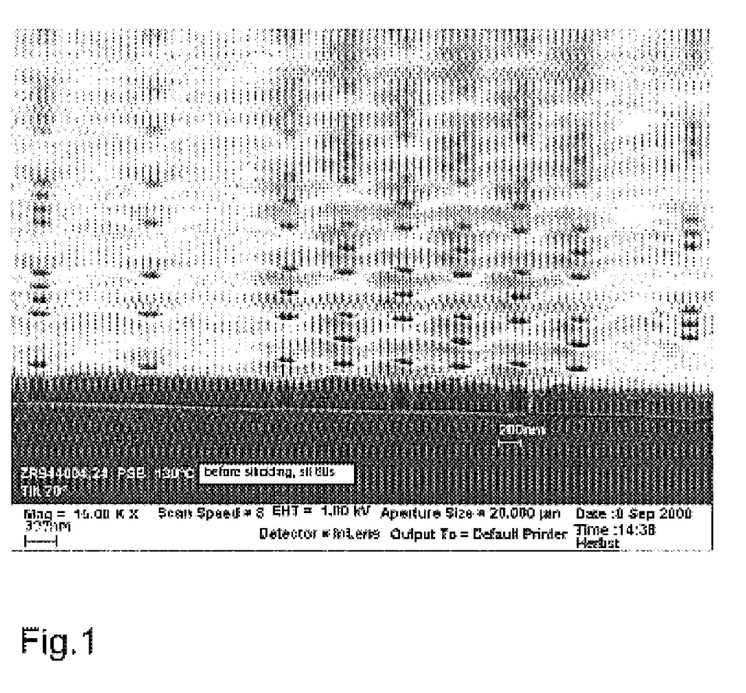
FIG. 1 shows an electron micrograph of a substrate surface treated by the method according to the invention.

The sample shown in FIG. 1 is produced as follows:

An 8" silicon wafer is coated with a 250 nm thick anhydride-containing photoresist layer by spin-coating and then dried on a hotplate at 130 C./60 s. This layer is then exposed at a wavelength of 248 nm by means of a halftone phase mask (6% attenuator) which has different hole structures (single holes, hole chains, etc.). The exposure unit used is a Wafer-Stepper EX4 from Canon, with an optical system which has a numerical aperture of 0.60. The exposure dose is 820 J/m$^2$. After the exposure, baking is carried out at 130° C./90 s on the hotplate and the photoresist layer is developed with a 0.26 N tetramethylammonium hydroxide standard developer by the puddle method for 40 s. After washing and drying, the photoresist layer is silylated with a solution of 3% by weight of bisaminopropyloligo-dimethyl-siloxane in 1-hexanol by the puddle method for 60 s. After washing and drying, the layer is inspected by scanning electron microscopy.

FIG. 1 shows a section of the photomask produced and aftertreated as described above. Circular contact openings which in each case correspond to the dark circular regions are introduced into the photoactivatable layer. In each case protuberances which are produced by scattered light and are referred to as sidelobes are evident around the contact orifices. These protuberances are caused by imaging errors of the optical exposure unit and by imaging errors of the photomask used. A large increase in the layer thickness indicates an increased light intensity in the latent image.

Figure 2A:
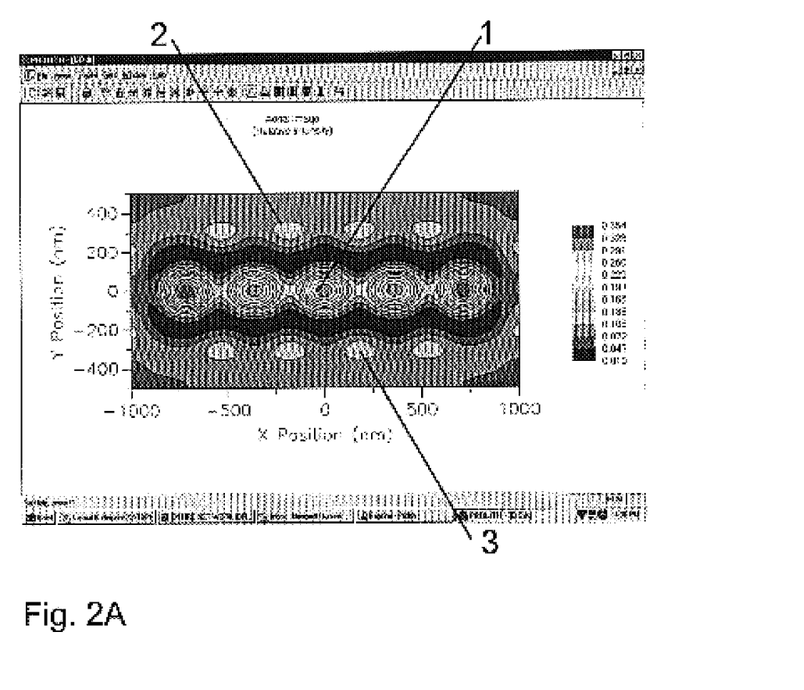
FIGS. 2A–C are three screen dumps showing a simulation of the intensity distribution on a section of the wafer surface using the Prolith 2/3D program from Finle Technologies.
Figure 2B:
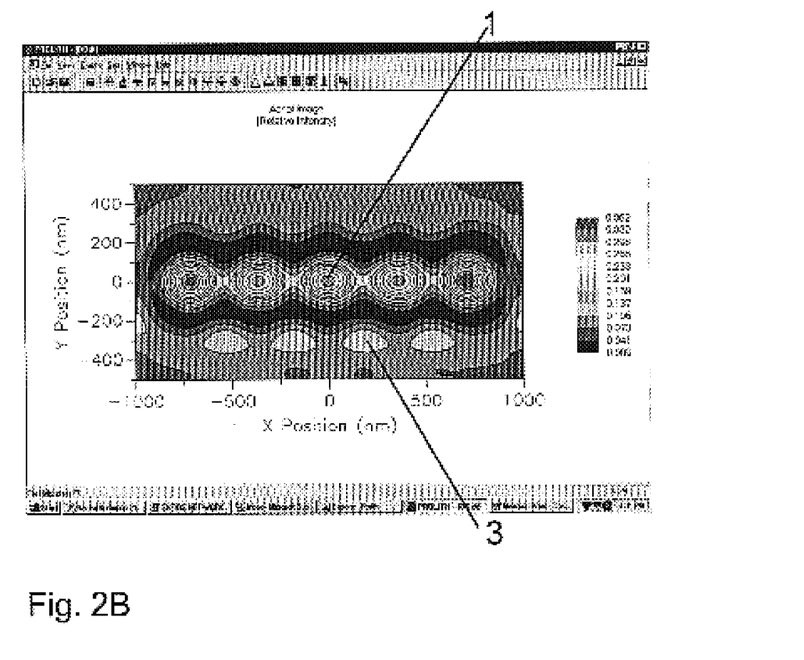
Figure 2C:
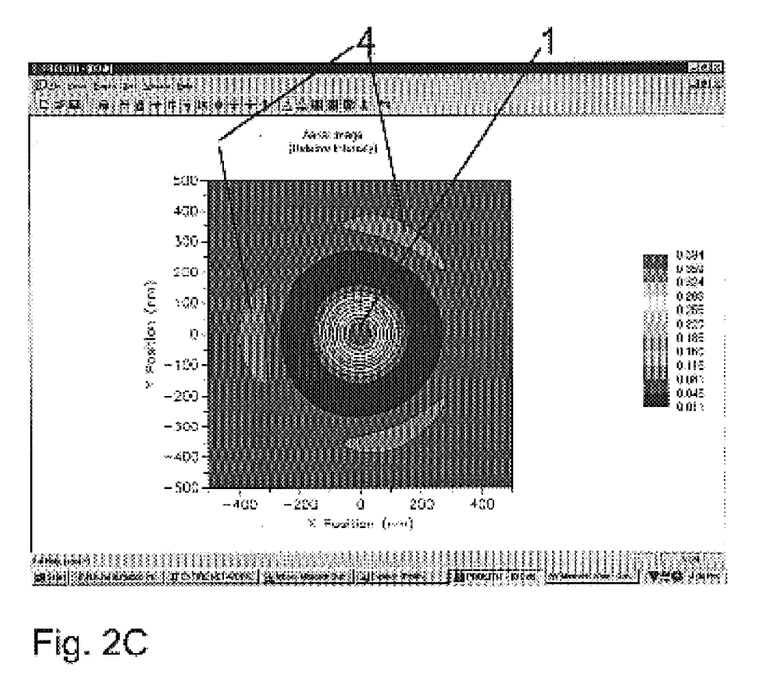

FIGS. 2A–2C each show a simulation of the intensity distribution of the exposure in the case of imaging of contact openings. The diagrams correspond in each case to sections of the surface of the photoresist shown in FIG. 1. The parameters of the simulation correspond to the parameters chosen for the experiment from FIG. 1.

FIG. 2A shows an intensity distribution around a contact hole chain, an ideal optical system being assumed for the exposure. The intensity distribution is symmetrical with respect to an axis passing through the midpoint of the contact orifices 1. In addition to the five contact orifices 1 which have the highest exposure intensity, four secondary maxima 2, 3 are observed in each case above and below, between the contact orifices. The secondary maxima 2 and 3 have the same intensity in each case.

FIG. 2B shows the same chain of contact orifices 1, except that an imaging error of the optical exposure unit, a coma, was simulated. The intensity of the secondary maxima 2 below and above the contact orifices 1 is now no longer symmetrical. The secondary maxima 2, which are arranged above the contact orifices 1 in FIG. 2A, have decreased in their intensity whereas the secondary maxima 3 arranged below the contact orifices 1 in FIG. 2A have increased in their intensity. The intensity distribution of the secondary maxima 2 and 3 correlates in each case with the experimentally determined increase in the layer thickness of the photoresist.

In FIG. 2C, a so-called "three-lobe aberration" was simulated. In addition to the intensity maximum of the individual contact hole 1, three secondary maxima 4 are observed. The intensity distribution of the exposure dose correlates with the experimentally determined increase in layer thickness of the photoresist, as is evident from a comparison with FIG. 1, wherein individual contact holes, around each of which three secondary maxima are arranged, are reproduced in the second row from left.

We claim:

1. A method of determining imaging errors of optical exposure units for the lithographic structuring of semiconductors, the method which comprises the following steps:
   (a) placing a photomask in an object plane of the optical exposure unit to be tested, the photomask defining a test image to be reproduced;
   (b) placing a photoactivatable layer in the image plane of the optical exposure unit to be tested, the photoactivatable layer containing a photoactivatable component and a compound permitting linkage of an amplification agent;
   (c) exposing the photoactivatable layer, the test image to be reproduced being reproduced in the photoactivatable layer and a chemical or physical change to the photoactivatable layer being effected in the photoactivatable layer in dependence on an incident light dose, for producing a latent image of the test image is produced;
   (d) applying an amplification agent to the exposed photoactivatable layer to react the amplification agent with the compound in the photoreactive layer, the reaction between the compound and the amplification agent being dependent on a local exposure dose incident on the photoactivatable layer, to increase a layer thickness of the photoactivatable layer as a function of the incident light dose;
   (e) removing excess amplification agent;
   (f) determining a local distribution of an increase in layer thickness of the photoactivatable layer;
   (g) comparing the distribution of the increase in layer thickness with the test image to be reproduced and determining the local increases in layer thickness outside the test image to be reproduced; and
   (h) assigning the local increases in layer thickness outside the test image to be reproduced to imaging errors of the optical exposure unit to be tested.

2. The method according to claim 1, wherein the photoactivatable component is a photoacid generator.

3. The method according to claim 1, wherein the compound permitting linkage of the amplification agent is a polymer having acid-labile groups that are split under action of acid and liberate a polar group.

4. The method according to claim 3, wherein the polymer contains further anchor groups that permit linkage of the amplification agent to the polymer with formation of a covalent bond.

5. The method according to claim 1, which comprises, subsequent to the exposing step, carrying out a contrasting step wherein the latent image is introduced as a chemical profile into the photoactivatable layer and a resist having contrast is obtained.

6. The method according to claim 5, which comprises developing the resist having contrast with a developer and removing exposed or unexposed sections of the resist having contrast.

7. The method according to claim 1, which comprises producing an enlarged topographical image of the surface of the photoactivatable layer treated with the amplification agent for determining the increase in the layer thickness.

8. The method according to claim 1, which comprises exposing with monochromatic radiation.

9. The method according to claim 1, which comprises exposing with laser radiation.

10. The method according to claim 8, which comprises exposing with monochromatic radiation having a wavelength of less than 500 nm.

11. The method according to claim 8, which comprises exposing with monochromatic radiation having a wavelength selected from the group consisting of 436, 356, 193, 157, and 142 nm.

12. The method according to claim 1, wherein the photoactivatable layer consists of a positive photoresist.

13. The method according to claim 1, wherein the photoactivatable layer consists of a negative photoresist.

14. A method of optimizing an optical exposure unit for the lithographic structuring of semiconductors, which comprises:

performing the method according to claim 1 to create a layer thickness distribution in a photoactivatable layer with an optical exposure unit to be optimized and using a test image;

determining an experimental distribution of the exposure intensity from the layer thickness distribution;

comparing the experimental distribution of the exposure intensity with a theoretical distribution of the exposure intensity;

determining an imaging error of the optical exposure unit from a difference between the experimental and the theoretical distribution; and modifying the optical exposure unit by alleviating the imaging error.

15. The method according to claim 14, which comprises completely eliminating the imaging error in the modifying step.

16. The method according to claim 14, which comprises, if several imaging errors are found, eliminating at least some of the imaging errors in the modifying step.

17. A method for determining a local exposure dose, which comprises:

producing a photoactivatable layer comprising a photoactivatable material on a substrate;

exposing the photoactivatable layer to exposure radiation to produce a latent image in the photoactivatable layer;

subsequently treating the photoactivatable layer with an amplification agent that reacts, in dependence on the locally incident exposure dose, with components of the photoactivatable material and thereby forms at least one chemical bond; and subsequently determining the local increase in the layer thickness of the photoactivatable layer and assigning the local increase in the layer thickness to a local exposure dose.

* * * * *